(12) United States Patent
Taguchi et al.

(10) Patent No.: US 6,392,895 B2
(45) Date of Patent: May 21, 2002

(54) ELECTRONIC CIRCUIT DEVICE

(75) Inventors: Naoto Taguchi; Tohru Kurosawa, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/774,633

(22) Filed: Feb. 1, 2001

(30) Foreign Application Priority Data

Mar. 8, 2000 (JP) .......................................... 12-063431

(51) Int. Cl.[7] .................................................. H05K 5/00
(52) U.S. Cl. ........................ 361/752; 361/736; 361/753; 439/76.1; 439/559
(58) Field of Search ................................ 361/752, 753, 361/736, 730; 439/76.1, 544, 954, 559; 385/90

(56) References Cited

U.S. PATENT DOCUMENTS

| | | | | |
|---|---|---|---|---|
| 5,145,356 A | * | 9/1992 | Minnis | 439/352 |
| 5,529,515 A | * | 6/1996 | Ohtaka et al. | 439/595 |
| 5,777,850 A | * | 7/1998 | Jakob et al. | 361/736 |
| 5,863,216 A | * | 1/1999 | Tsuji et al. | 439/489 |
| 5,997,344 A | * | 12/1999 | Shinozaki | 439/489 |
| 6,011,700 A | * | 1/2000 | Matsuzaki | 361/816 |
| 6,042,392 A | * | 3/2000 | Tsuji | 439/76.1 |

FOREIGN PATENT DOCUMENTS

JP   9-321462   12/1997

* cited by examiner

Primary Examiner—Jeffrey Gaffin
Assistant Examiner—Tuan Dinh
(74) Attorney, Agent, or Firm—Armstrong, Westerman & Hattori, LLP

(57) ABSTRACT

An electronic circuit device 21 consists of a connector 23 provided with guide projections 45, a circuit board 24 on which the connector 23 is mounted, and a case 22 provided with guide recesses 36. Since the guide recesses 36 are broader in width at the end portions of the side walls of the case 22, and the guide projections 45 are narrower in width at the side where the connector 23 is first inserted, no high positional accuracy is required when the connector is received in the case. Both the guide recesses 36 and the guide projections 45 include inclined faces 37, 37, 47, 47 to form a V-shape.

4 Claims, 9 Drawing Sheets

ELECTRONIC CIRCUIT DEVICE

BACKGROUND OF THE INVENTION

1. Field of the Invention

The present invention relates to an electronic circuit device comprising a connector, a circuit board on which the connector is mounted, and a case for containing the above.

2. Description of the Related Art

The electronic circuit device of this type is disclosed, for example, in Japanese Patent Laid Open Publication No. 9-321462 of Japanese Patent Application No. 8-139186 filed on May 31, 1996 by KANSEI CORP.

In FIG. 10, the above described electronic circuit device has an upper case 1. There are formed continuous openings 2 and 3 in the upper case 1. The upper case 1 has a fitting flange 4 at a circumferential edge of the opening 2 so as to project outwardly. Boss portions 6 having a same height are integrally formed at inner four corners of an upper wall face 5 of the upper case 1. An electronic circuit board 8 equipped with an electronic component 7 is fitted to the boss portion 6 from a lower side by means of screws 9. A connector 10 adapted to be engaged with an exterior circuit (a mating connector) is fitted to the electronic circuit board 8 through the opening 3.

A plurality of lead terminals 12 of the connector 10 are soldered to the electronic circuit board 8. A projecting rib 14 is formed on an upper wall of a housing 13 of the connector 10 so as to project upward as seen in FIG. 11. When the connector 10 is received in the case, the projecting rib 14 is adapted to be engaged in a pair of projections 15, 15 which are formed on the upper wall face 5 of the upper case 1. Reference numeral 16 represents a lower case which is fixed to an edge portion of the opening 2 of the upper case 1 by means of screws.

In the above described prior art, when the connectors are mated, the projecting rib 14 of the connector 10 is abutted against the projections 15 of the upper case 1 to restrict movement of the connector. This eliminates a fear of breakdown of the electronic circuit board 8 and can enhance reliability.

However, in the conventional device, because a distance between the projections 15, 15 is narrow, careful attention must be paid to positional alignment when the connector 10 is placed in the upper case 1 for assembling. Therefore, not to speak of bad workability, the projecting rib 14 may not be engaged between the projections 15, 15 in some cases, and there has been a fear that the electronic circuit device may be assembled even though the connector 10 is contained in an unstable state.

Moreover, the fixing work of the connector 10 to the electronic circuit board 8 by means of the screws is annoying and adversely affects workability and cost.

The present invention has been made in view of the above circumstances, and it is an object of the invention to provide an electronic circuit device which can be reliably assembled with the improved workability.

SUMMARY OF THE INVENTION

In order to solve the above described problems, there is provided, according to a first aspect of the present invention, an electronic circuit device comprising a connector to be connected with an exterior circuit, a circuit board on which the connector and electronic components are mounted, and a case having an opening which is defined by end portions of its side walls, the connector and the circuit board being adapted to be received in the case through the opening, wherein the case includes guide recesses in a concave shape whose width becomes gradually narrower from the end portions of the side walls toward base end portions of the side walls, and the connector includes guide projections which are adapted to be guided along the guide recesses and are in a convex shape whose width becomes gradually broader from a side which is first inserted into the case toward the opposite side.

According to a second aspect of the present invention, both the guide recesses and the guide projections include inclined faces to form a V-shape.

According to a third aspect of the present invention, respective ones of the inclined faces of the guide recesses and the guide projections serve also as sealing faces.

According to a fourth aspect of the present invention, the connector is provided with positioning and supporting projections which are passed through the circuit board.

According to the first aspect of the present invention, the electronic circuit device consists of the connector provided with the guide projections, the circuit board on which the connector is mounted, and the case provided with the guide recesses. Since the guide recesses are broader in width at the end portions of the side walls of the case, and the guide projections are narrower in width at the side where the connector is first inserted, no high positional accuracy is required when the connector is received in the case. Because the guide projections are guided into the guide recesses, the connector will be never received in the case in an unstable state. Thus, the connector can be reliably contained in the case.

According to the second aspect of the present invention, the connector is contained in the case in such a manner that the guide projections are fitted in the guide recesses. Since an action received from the exterior circuit on occasion of engaging the connectors will be exerted on the guide recesses by way of the guide projections, concentration of a stress on the circuit board will be dispersed.

According to the third aspect of the present invention, when the connector has been contained in the case, the shielding performance between the case and the connector can be assured by the respective ones of the inclined faces of the guide recesses and the guide projections.

According to the fourth aspect of the present invention, by inserting the projections on the connectors into the circuit board, the connector can be positioned and supported. Therefore, work for fitting the connector to the circuit board by means of the screws as in the prior art can be eliminated.

DESCRIPTION OF THE PREFERRED EMBODIMENT

Figure 1:
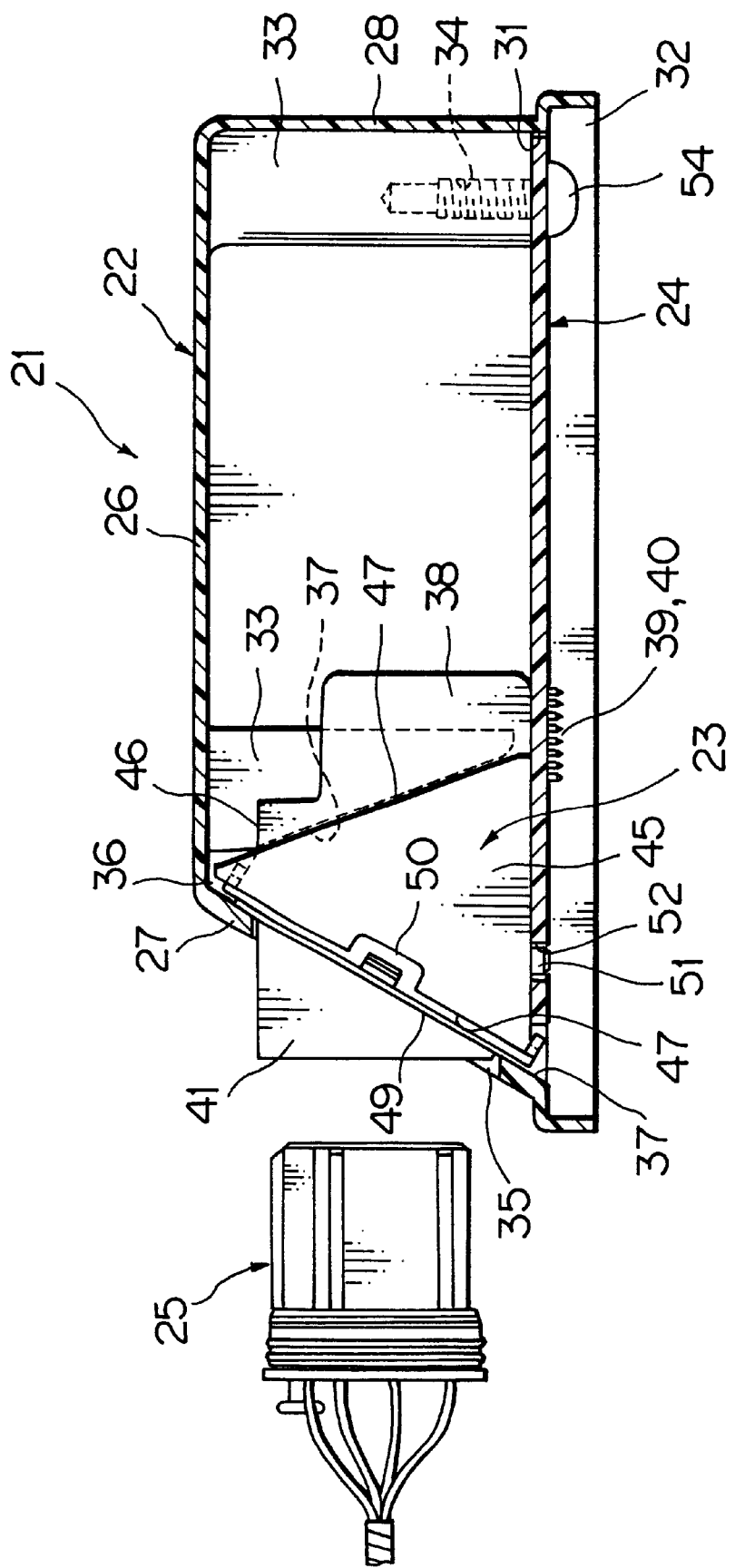
FIG. 1 is a sectional view showing one embodiment of an electronic circuit device according to the present invention.

Now, referring to the drawings, one embodiment of the present invention will be described.

Figure 2:
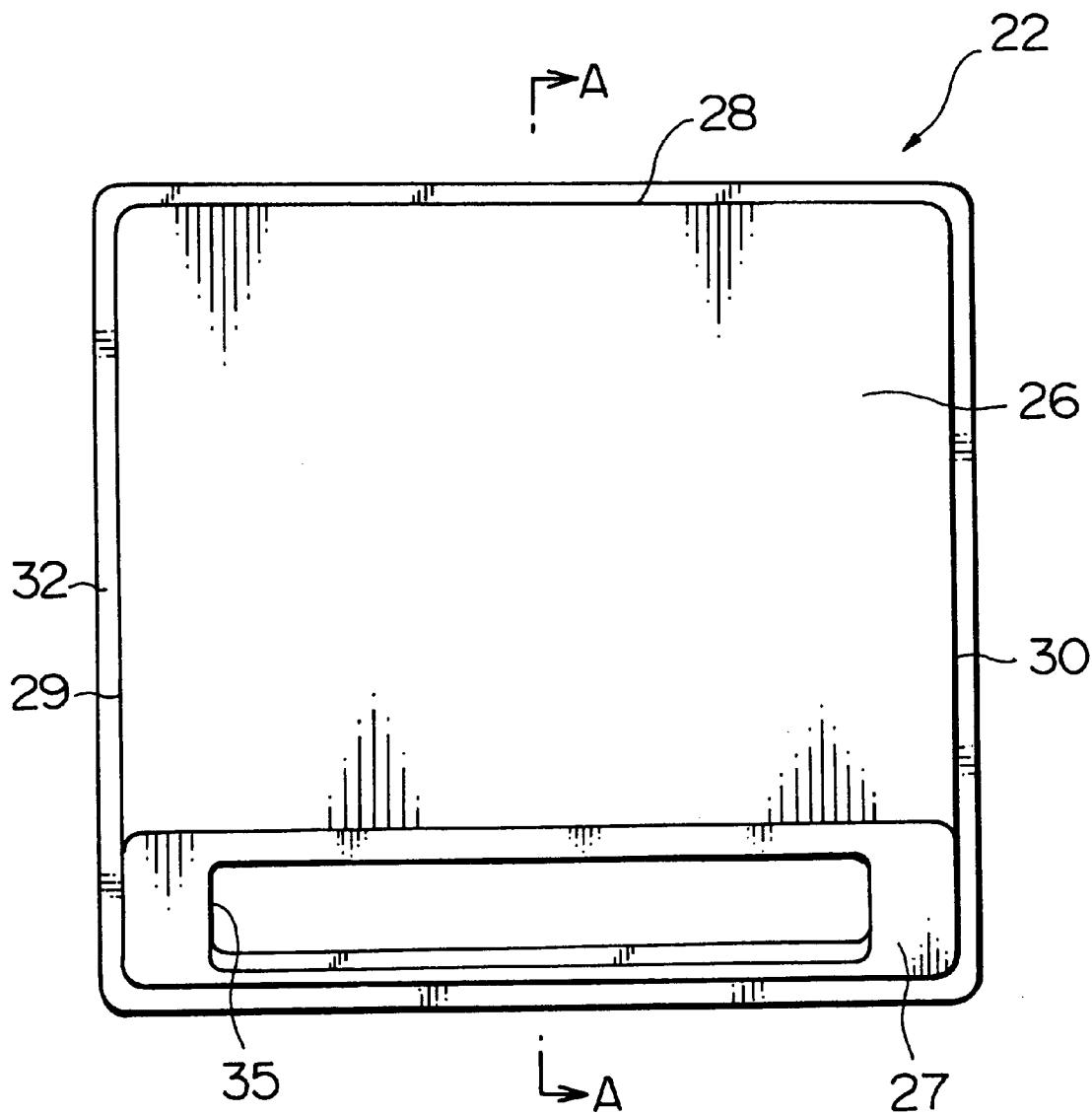
FIG. 2 is a plan view of a case.
Figure 3:
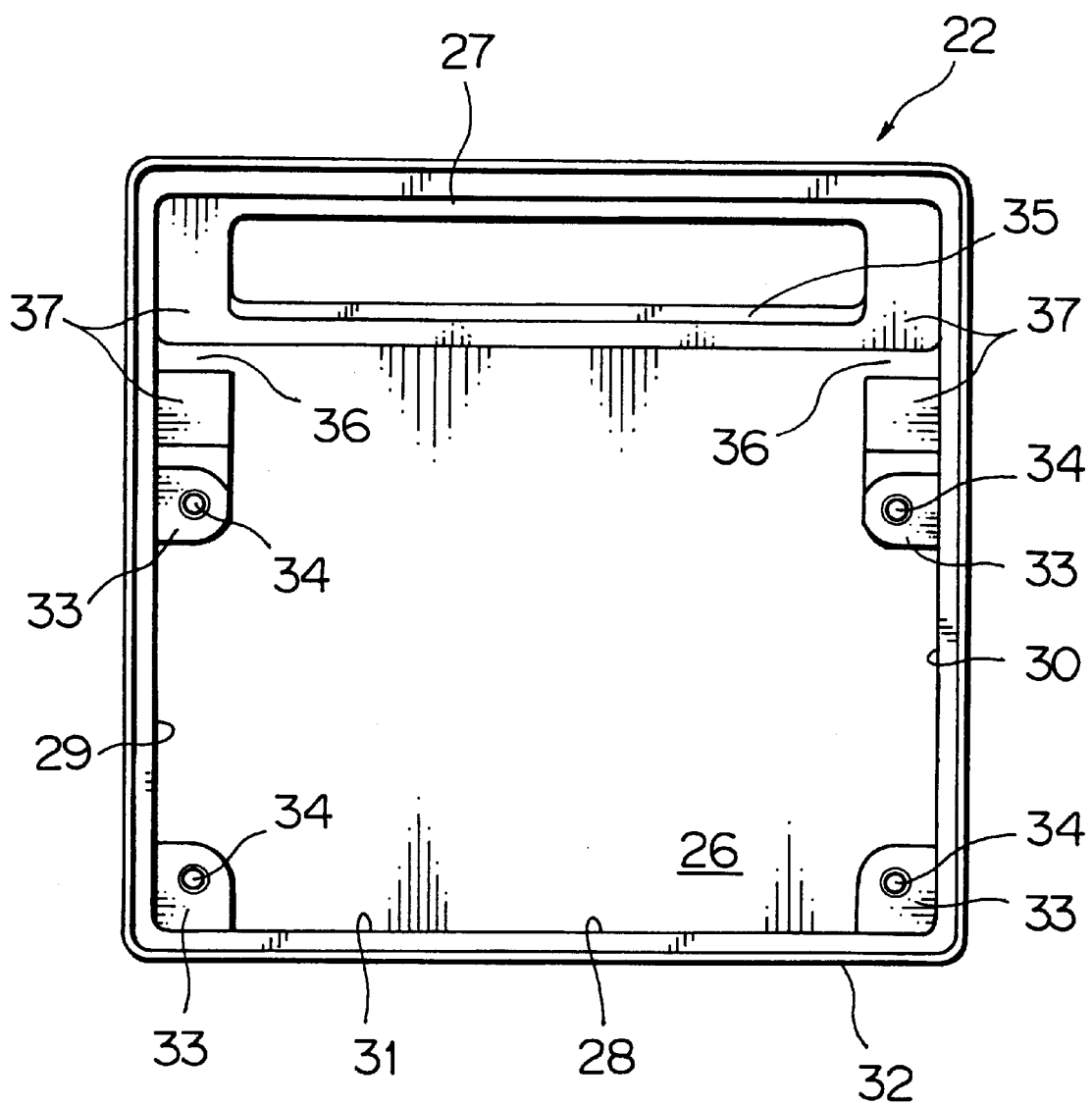
FIG. 3 is a bottom view of the case.
Figure 4:
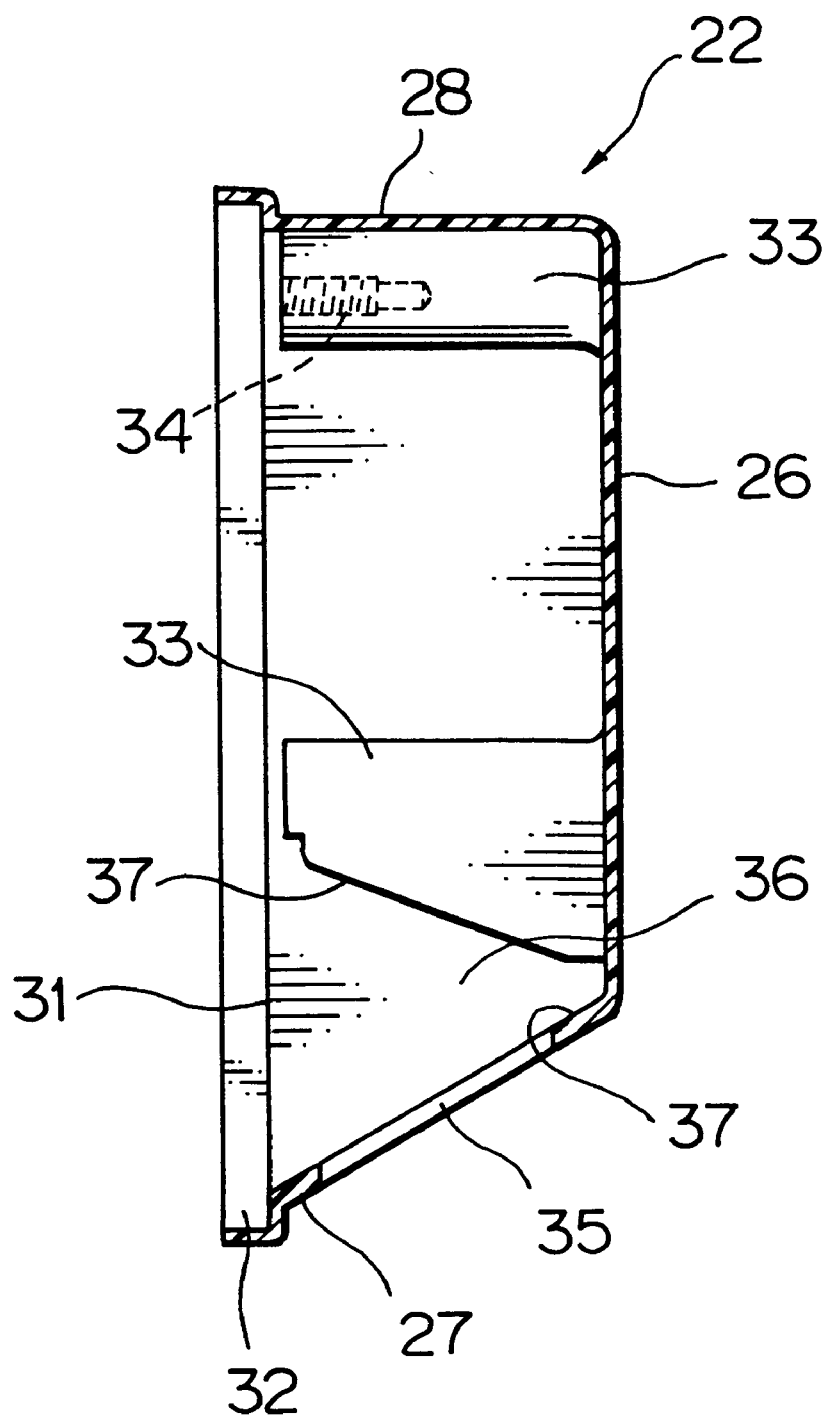
FIG. 4 is a sectional view taken along a line A—A of FIG. 2.
Figure 5:
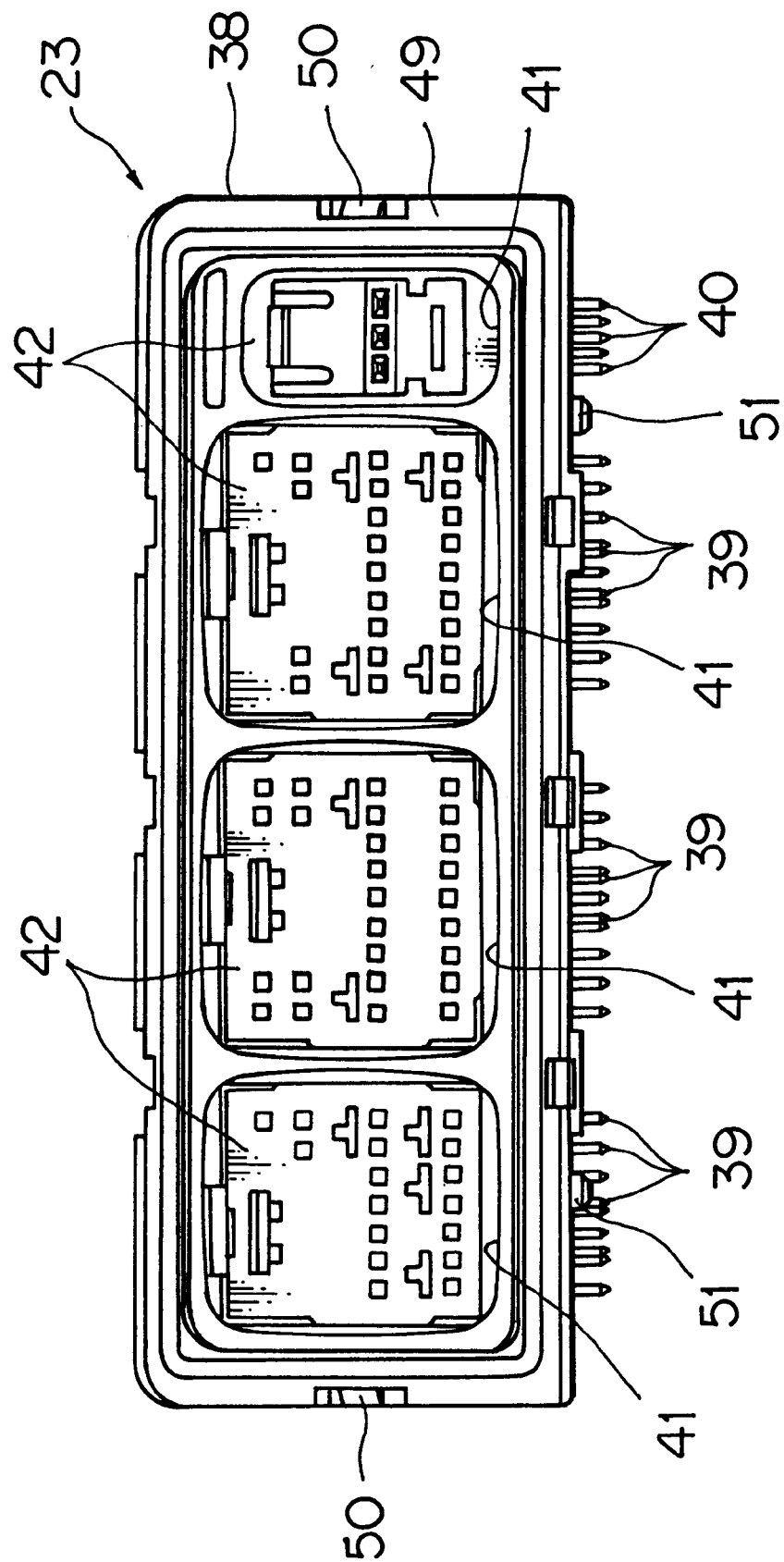
FIG. 5 is a front view of a connector.
Figure 6:
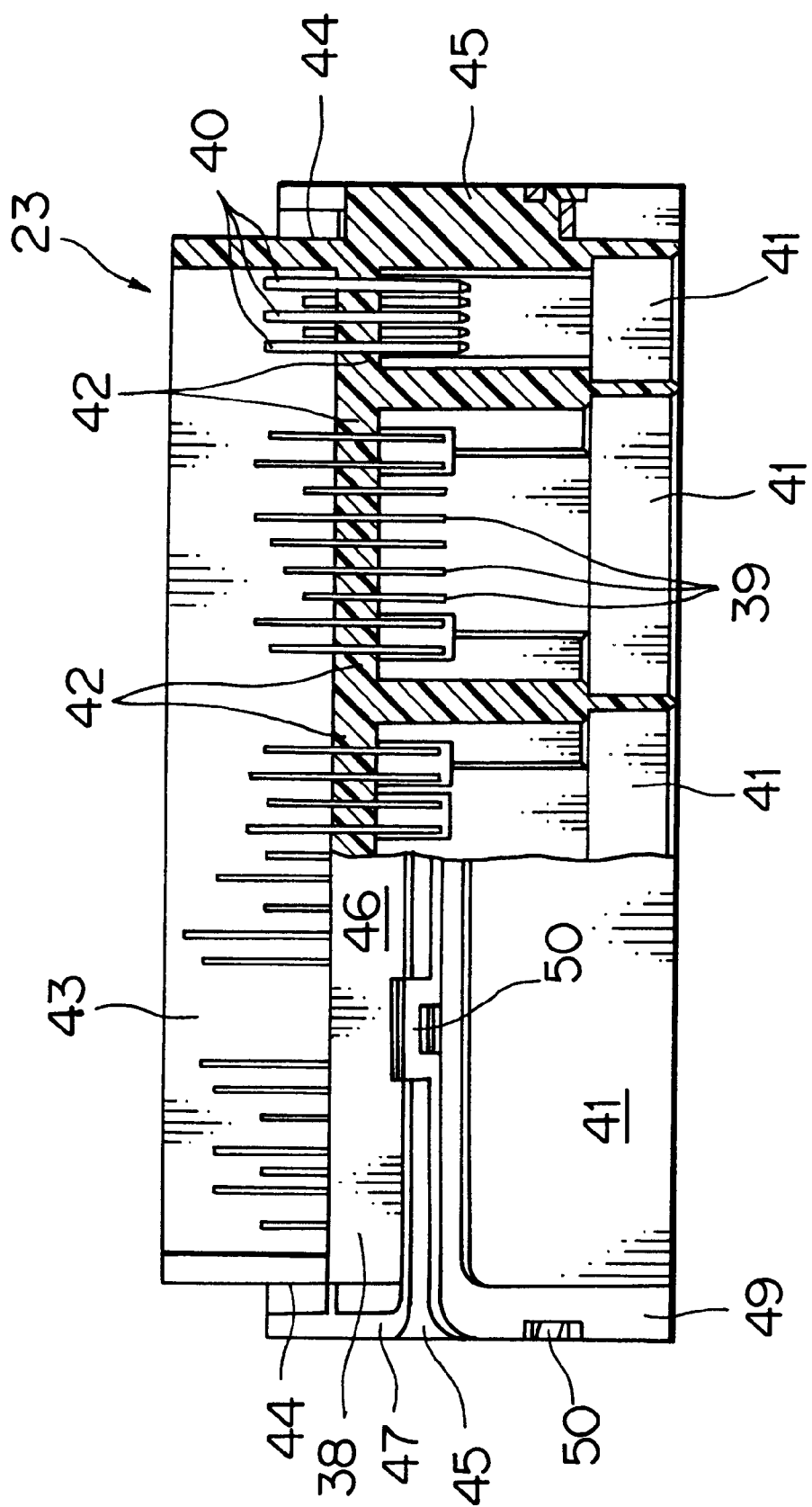
FIG. 6 is a plan view of the connector partly in section.
Figure 7:
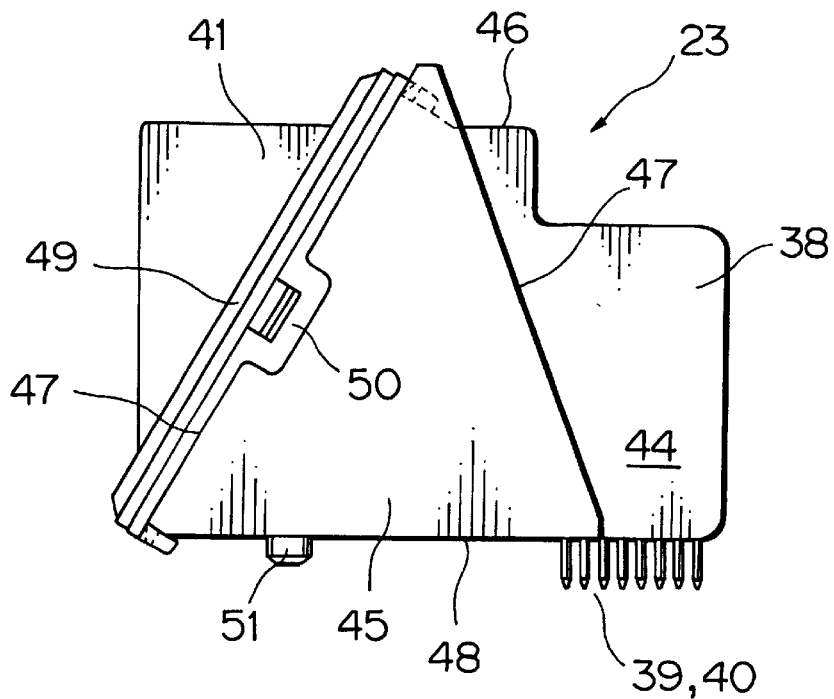
FIG. 7 is a right side view of the connector.

FIG. 1 is a sectional view showing one embodiment of an electronic circuit device according to the present invention. FIGS. 2 to 4 are various views of a case, and FIGS. 5 to 7 are various views of a connector.

In FIG. 1, reference numeral 21 represents an electronic circuit device such as ECU (engine control unit) adapted to be mounted on a vehicle, for example. The electronic circuit device 21 is composed of a case 22, a connector 23 which is contained in the case 22, and a circuit board 24 on which the connector 23 is mounted. A mating connector 25 as an exterior circuit is adapted to be engaged with the connector 23.

The above described structure will be fully described hereunder.

The case 22 is made of synthetic resin, and consists of a bottom wall 26 and side walls 27 to 30 provided on a circumferential edge of the bottom wall 26 formed into a bottomed box in a substantially rectangular shape. An opening 31 is defined by edges of the side walls 27 to 30. A rectangular frame portion 32 swelling outward is formed around the opening 31.

The bottom wall 26 is formed in a rectangular shape and integrally provided with boss portions 33 having a same height at inner four corners of the bottom wall 26. The boss portions 33 continue to the side walls 28 to 30 and have threaded bores 34 in flat faces at their distal ends. The distal ends of the boss portions 33 are positioned lower than the opening 31 by an amount of a thickness of the circuit board 24 (see FIG. 1).

Describing in more detail the side walls 27 to 30, the side wall 27 is positioned at a side connected to the mating connector 25 (see FIG. 1), while the side plate 28 is positioned at a side opposed to the side wall 27. The side walls 29 and 30 are positioned on the left side and on the right side respectively, provided that the side wall 27 is at the front.

The side walls 28 to 30 are uprightly provided at the right angle with respect to the bottom wall 26, while the side wall 27 only is inclined. The side wall 27 is formed with a rectangular opening 35 through which a part of the connector 23 is adapted to protrude. The side wall 28 is flat. There are integrally formed guide recesses 36, 36 inside the side walls 29 and 30.

Each of the guide recesses 36, 36 has inclined faces 37, 37. One of the inclined faces 37, 37 is composed of the side wall 27, and the other is composed of the boss portion 33 which is located adjacent to the side wall 27. The guide recess 36 is in a V-shape embraced by the two inclined faces 37, 37. The guide recess 36 is formed in such a manner that a distance between the inclined faces 37, 37 is gradually decreased from the top ends to the base ends of the side walls 29, 30, in other words, toward the bottom wall 26. The inclined face 37 composed of the side wall 27 serves also as a sealing face.

As shown in FIGS. 5 to 7, the connector 23 is composed of a connector housing 38 and a plurality of terminals 39 and 40 contained in the connector housing 38.

The connector housing 38 which is formed of synthetic resin has four connector engaging parts 41 although the number is not limited to four. Each of the connector engaging parts 41 has a back wall 42 to which determined terminals 39 or 40 are adapted to be fitted by insert molding or so. Numeral 43 represents a guide plate for positioning the terminals.

Side walls 44, 44 of the connector housing 38 are integrally provided with respective guide projections 45, 45. Each of the guide projections 45 is in a shape of a triangle, an apex of which is adjacent to an upper wall 46, and protrudes outwardly from the side wall 44. It is to be noted that inclined faces 47, 47 of the guide projection 45 embracing the apex correspond to the inclined faces 37, 37 of the guide recess 36 (see FIG. 4). In other words, the guide projection 45 has a V-shape or a triangular shape in such a manner that a distance between the inclined faces 47, 47 is increased from the upper wall 46 toward a bottom wall 48.

A seal packing 49 is provided on the connector housing 38 including the inclined faces 47, 47 positioned at open sides of the connector engaging parts 41. Reference numeral 50 represents a locking member for the seal packing 49. The inclined faces 47, 47 positioned at the open sides serve also as sealing faces.

The bottom wall 48 of the connector housing 38 is integrally provided with projections 51 which are adapted to serve as positioning and supporting members for the circuit board 24 (see FIG. 1). The projection 51 has a spherical tip end protruding by a thickness of the circuit board 24. The tip end of the projection 51 is chamfered in order to facilitate an insertion into the circuit board 24.

The terminals 39 and 40 are made of electrically conductive metal, and bent in an L-shape. When the terminals 39 and 40 have been received in the connector housing 38, they project into the corresponding engaging parts 41 at their one ends, and guided out from the guide plate 43 at the other ends.

Referring back to FIG. 1, a plurality of circuits having desired patterns are formed on the circuit board 24 and a plurality electronic components are mounted thereon. The circuit board 24 is further provided with holes 52 corresponding to the projections 51 of the connector 23, and a plurality of terminal insertion holes 53 (see FIG. 9) corresponding to the aforesaid other ends of the terminals 39 and 40 (FIG. 6). A diameter of the hole 52 is equal to or slightly larger than a diameter of the projection 51.

Figure 9:
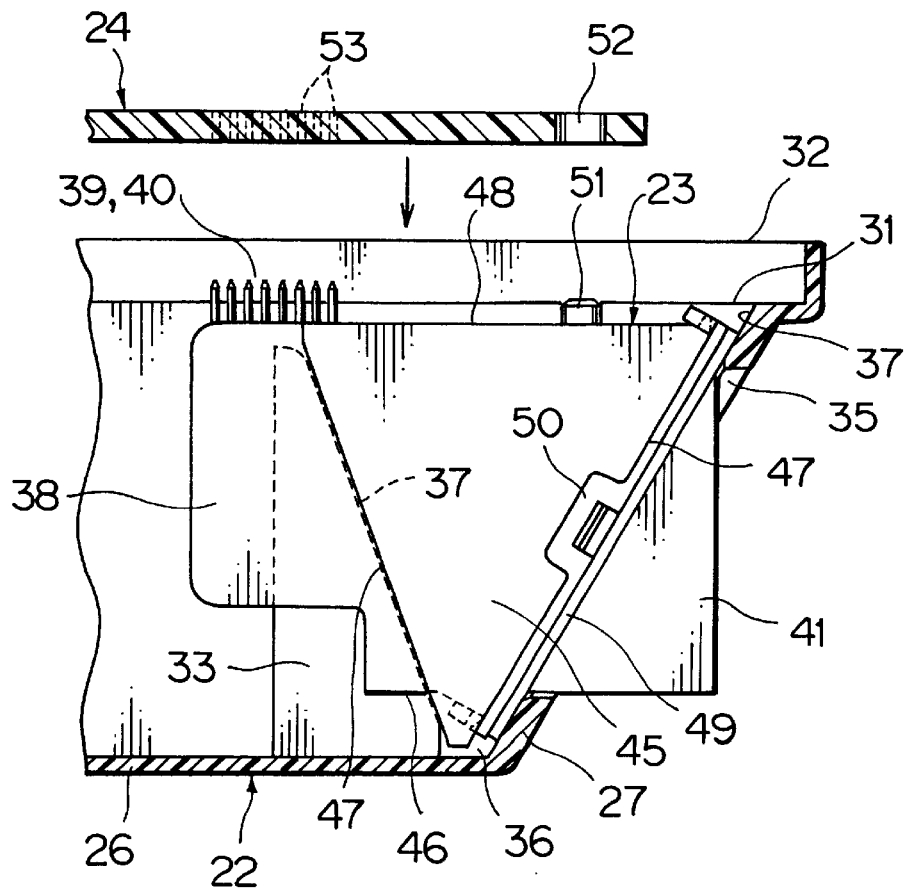
FIG. 9 is an explanatory view showing an assembled state of the device after the connector has been received in the case.
Figure 8:
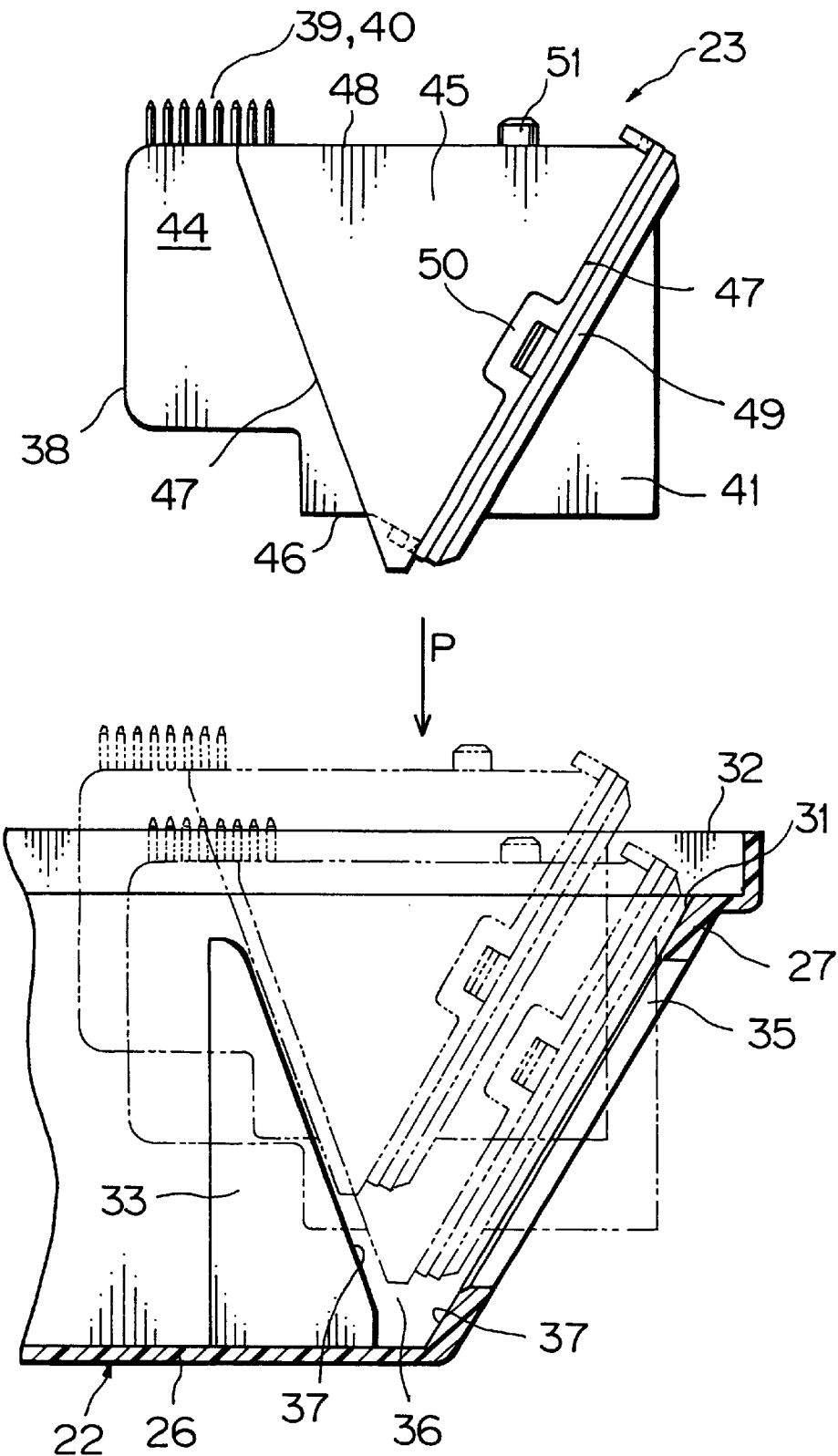
FIG. 8 is an explanatory view showing assembling steps before and while the connector is received in the case.
Figure 10:
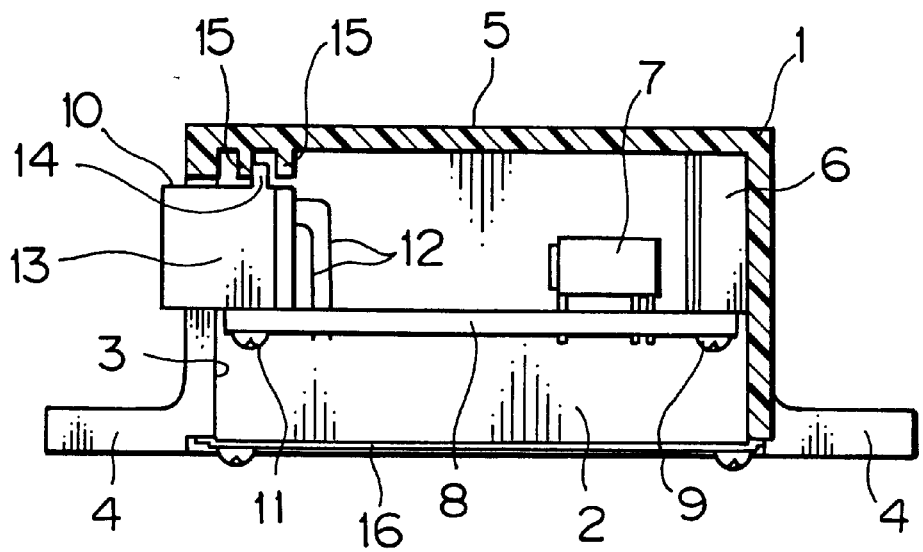
FIG. 10 is a sectional view of a conventional electronic circuit device.
Figure 11:
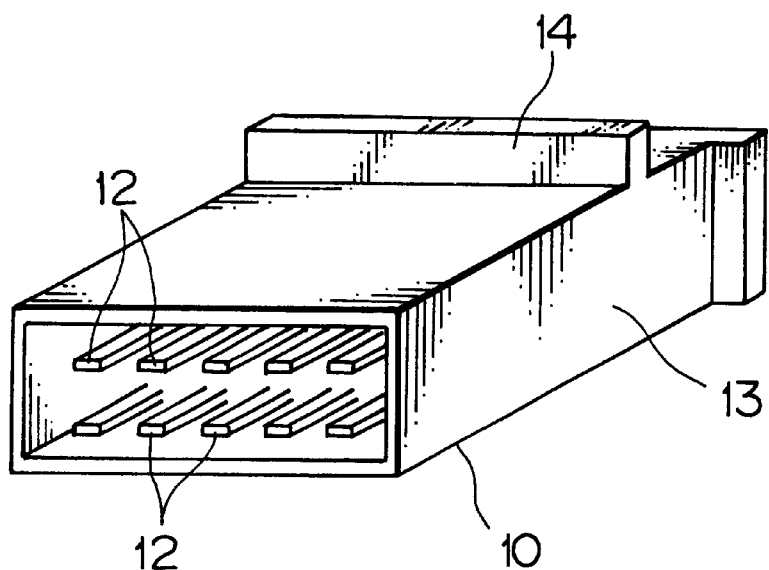
FIG. 11 is a perspective view of a connector of FIG. 10.

Referring now to FIGS. 8, 9 and FIG. 1, a manner of assembling the electronic circuit device 21 will be described.

FIG. 8 is an explanatory view showing assembling steps before and while the connector is received, and FIG. 9 is an explanatory view showing an assembled state after the connector has been received.

It is to be noted that the connector 23 and the circuit board 24 have been assembled and wired beforehand in a predetermined manner.

In FIG. 8, the connector 23 is set in the case 22 as a first step. The connector 23 is positioned at the opening 31 of the case 22, and the upper wall 46 of the connector 23 is at first inserted. In other words, the apexes of the guide projections 45, 45 of the connector 23 (only one is shown in the drawing) are engaged in the guide recesses 36, 36 in the case 22 at a position where the distance between the inclined faces 37 and 37 is largest.

Then, the entire connector 23 is inserted in the case 22 in a straightly dropped manner in a direction of an arrow P. On this occasion, the guide projections 45, 45 are guided into the guide recesses 36, 36 in the case 22. The connector 23 can be guided into a determined position in the case 22 by means of the guide recesses 36, 36 and the guide projections 45, 45, even in case where the connector 23 is not adequately aligned with respect to the case 22. Accordingly, the connector 23 can be reliably contained in the case 22 with no need of high positioning accuracy. Moreover, the inclined faces 47, 47 at the open end side are brought in tight contact with the inclined faces 37, 37 on the side wall 27 interposing the seal packing 49. This assures sealing performance between the case 22 and the connector 23. In other words, the sealing performance between the case 22 and the connector 23 can be obtained by simply dropping the connector 23 into the case 22.

After the connector 23 has been received in the case 22, the circuit board 24 is mounted on the connector 23 as shown in FIG. 9, and received in the case 22 through the opening 31. On this occasion, the projections 51 of the connector 23 are passed through the holes 52, and the aforesaid other ends of the terminals 39 and 40 are passed through the terminal insertion holes 53.

Then, as shown in FIG. 1, the circuit board 24 is fixed by means of screws 54 (The connector 23 need not be directly screwed), and the other ends of the terminals 39 and 40 are soldered to the circuit board 24. The screws 54 are spirally engaged in the threaded bores 34 in the boss portions 33 to fix the circuit board 24 to the case 22. In the above described manner, a series of the assembling steps of the electronic circuit device 21 have been completed.

When the mating connector 25 is engaged with the connector 23, an action of the mating connector 25 may affect the guide recesses 36, 36 by way of the guide projections 45, 45. However, the action will not directly affect the circuit board 24.

It is apparent that various changes and modifications can be applied to the present invention within a scope of the invention. For example, the side walls 29 and 30 may be directly concaved so as to form similar structures to the guide recesses 36, 36. In addition, either of the inclined faces 37, 37 are made vertical so as to form a substantially L-shape.

What is claimed is:

1. An electronic circuit device comprising a connector to be connected with an exterior circuit, a circuit board on which said connector and electronic components are mounted, and a case having an opening which is defined by end portions of its side walls, said connector and said circuit board being adapted to be received in said case through said opening, wherein said case includes guide recesses in a concave shape whose width becomes gradually narrower from said end portions of said side walls toward base end portions of said side walls, and said connector includes guide projections which are adapted to be guided along said guide recesses and are in a convex shape whose width becomes gradually broader from a side which is first inserted into said case toward the opposite side.

2. The electronic circuit device according to claim 1, wherein both said guide recesses and said guide projections include inclined faces to form a V-shape.

3. The electronic circuit device according to claim 2, wherein respective ones of said inclined faces of said guide recesses and said guide projections serve also as sealing faces.

4. The electronic circuit device according to anyone of claims 1 to 3, wherein said connector is provided with positioning and supporting projections which are passed through said circuit board.

* * * * *